(12) United States Patent
Xin et al.

(10) Patent No.: US 11,404,678 B2
(45) Date of Patent: Aug. 2, 2022

(54) DISPLAY PANEL, MASK, METHOD FOR MANUFACTURING DISPLAY PANEL, AND DISPLAY DEVICE

(71) Applicants: WUHAN TIANMA MICROELECTRONICS CO., LTD., Wuhan (CN); WUHAN TIANMA MICROELECTRONICS CO., LTD. SHANGHAI BRANCH, Shanghai (CN)

(72) Inventors: Yu Xin, Shanghai (CN); Lijing Han, Shanghai (CN); Yuan Li, Shanghai (CN)

(73) Assignees: WUHAN TIANMA MICROELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 0 days.

(21) Appl. No.: 16/249,906

(22) Filed: Jan. 17, 2019

(65) Prior Publication Data
US 2019/0148680 A1    May 16, 2019

(30) Foreign Application Priority Data
Aug. 29, 2018    (CN) .......................... 201810997041.0

(51) Int. Cl.
*H01L 27/32* (2006.01)
*H01L 51/56* (2006.01)
(Continued)

(52) U.S. Cl.
CPC .......... *H01L 51/56* (2013.01); *H01L 27/3276* (2013.01); *H01L 51/0011* (2013.01);
(Continued)

(58) Field of Classification Search
CPC ..... H01L 25/13; H01L 25/0753; H01L 33/44; H01L 27/326; H01L 27/3276; H01L 51/5225
See application file for complete search history.

(56) References Cited

U.S. PATENT DOCUMENTS

| 2016/0079334 A1* | 3/2016 | Lee | ...................... | H01L 27/3276 257/40 |
| 2017/0271421 A1* | 9/2017 | Jinbo | ................... | H01L 51/5253 |

(Continued)

FOREIGN PATENT DOCUMENTS

| CN | 1592526 A | 3/2015 |
| CN | 104576951 A | 4/2015 |

(Continued)

OTHER PUBLICATIONS

Office Action of Chinese Patent Application No. 201810997041.0 dated Mar. 4, 2020.

*Primary Examiner* — Michele Fan
(74) *Attorney, Agent, or Firm* — Kilpatrick Townsend & Stockton LLP

(57) ABSTRACT

The present disclosure provides a display panel, a mask, a method for manufacturing a display panel, and a display device. The display panel has a hollow region and a display region surrounding the hollow region. The display panel includes a plurality of light-emitting devices arranged in the display region. The plurality of light-emitting devices includes a common layer, and no common layer is formed in the hollow region. The common layer includes at least one first common portion and at least one second common portion that are disposed in a same layer. The common layer further includes at least one uneven layer disposed between the at least one first common portion and the at least one second common portion.

11 Claims, 15 Drawing Sheets

(51) Int. Cl.
 *H01L 51/00* (2006.01)
 *H01L 51/52* (2006.01)

(52) U.S. Cl.
 CPC ...... *H01L 51/0021* (2013.01); *H01L 51/0096* (2013.01); *H01L 51/5225* (2013.01)

(56) References Cited

U.S. PATENT DOCUMENTS

| | | | |
|---|---|---|---|
| 2017/0277219 A1* | 9/2017 | Chung | G06F 1/1637 |
| 2018/0198067 A1* | 7/2018 | Kim | H01L 51/0011 |
| 2018/0198068 A1* | 7/2018 | Morse | C07D 495/04 |
| 2019/0114987 A1* | 4/2019 | Li | H04N 9/312 |
| 2019/0165063 A1* | 5/2019 | Lee | H01L 27/3276 |
| 2019/0229169 A1* | 7/2019 | Huang | H01L 29/78633 |
| 2019/0305222 A1* | 10/2019 | Jung | H01L 51/5253 |
| 2020/0411604 A1* | 12/2020 | Yang | H01L 51/56 |

FOREIGN PATENT DOCUMENTS

| | | | |
|---|---|---|---|
| CN | 107236927 A | | 10/2017 |
| KR | 20150043827 A | * | 4/2015 |

* cited by examiner

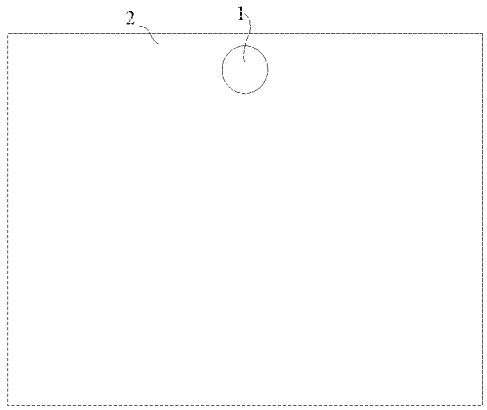

FIG. 17

```
providing a base substrate and the mask; the base
substrate includes a non-vapor-deposition region and a     — S1
vapor-deposition region surrounding the non-vapor-
deposition region
                         ↓
                                                           — S2
forming a common layer in the vapor-deposition region
sequentially by vapor deposition through the main mask
and the auxiliary mask, no common layer being formed
in the non-vapor-deposition region
```

FIG. 18

```
forming the first common portion in the vapor-deposition   — S21 ⎫
region by vapor deposition through the first aperture             ⎬ S2
region and the second aperture region of the main mask            ⎪
                         ↓                                 — S22 ⎭
covering the first common portion using the shielding
strip of the auxiliary mask; forming the second common
portion in the vapor-deposition region by vapor
deposition through the aperture region of the auxiliary
mask; and forming the uneven portion between the first
common portion and the second common portion
```

FIG. 19

DISPLAY PANEL, MASK, METHOD FOR MANUFACTURING DISPLAY PANEL, AND DISPLAY DEVICE

CROSS-REFERENCE TO RELATED APPLICATIONS

The present application claims priority to Chinese Patent Application No. 201810997041.0, filed on Aug. 29, 2018, the content of which is incorporated herein by reference in its entirety.

FIELD

The present disclosure relates to the field of display technologies, and in particular, relates to a display panel, a mask, a method for manufacturing a display panel, and a display device.

BACKGROUND

With increasing demands for diversified usage of display devices by users and design requirements for high screen-to-body ratio of display devices, devices such as cameras are usually embedded in the interior of display devices to reduce the size of the frame of the display device.

In the related art, a cutting process is generally adopted to remove the part of the display panel where the camera is to be placed, so as to form a display panel including a hollow region, in which a device such as a camera can be disposed. However, since a shape of the camera is usually irregular, cutting difficulty of the display panel is increased. Moreover, for an OLED display, after the display panel is cut, material residues would inevitably occur, which may affect reliability of subsequent packaging of the display panel.

SUMMARY

In view of this the present disclosure provides a display panel, a mask, a method for manufacturing a display panel, and a display device, aiming to solve the problem in the related art that it is difficult to manufacture a display panel including a hollow region.

In one embodiment, the present disclosure provides a display panel. The display panel has a hollow region and a display region surrounding the hollow region. The display panel includes a plurality of light-emitting devices arranged in the display region. The plurality of light-emitting devices includes a common layer, and no common layer is arranged in the hollow region. The common layer includes at least one first common portion and at least one second common portion that are disposed in a same layer. The common layer further includes at least one uneven portion disposed between the at least one first common portion and the at least one second common portion.

In another embodiment, the present disclosure provides a mask. The mask includes a main mask and at least one auxiliary mask. The main mask includes at least two aperture regions and at least one shielding region. The at least two aperture regions and the at least one shielding region are alternately arranged in a first direction. The at least two aperture regions of the main mask include a first aperture region and at least one second aperture region. The first aperture region of the main mask is provided with a shielding block, and a width of the first aperture region in the first direction is equal to a width of the shielding block in the first direction. Each of the at least one shielding region of the main mask is provided with a shielding strip extending in a second direction. Each of the at least one auxiliary mask includes at least one aperture region and at least one shielding region. The at least one aperture region and the at least one shielding region of each of the at least one auxiliary mask being alternately arranged along the first direction. Each shielding region of the at least one auxiliary mask is provided with a shielding strip extending along the second direction. Each shielding strip of the main mask has a same shape and a same area as each aperture region of the at least one auxiliary mask. Each shielding strip of the at least one auxiliary mask has a same shape and a same area as each second aperture region of the main mask.

In still another embodiment, the present disclosure provides a method for manufacturing a display panel. The method includes: providing a base substrate and the abovementioned mask, the base substrate including a non-vapor-deposition region and a vapor-deposition region surrounding the non-vapor-deposition region; and forming a common layer in the vapor-deposition region sequentially by vapor deposition through the main mask and the at least one auxiliary mask, no common layer being formed in the non-vapor-deposition region. The common layer includes a first common portion, a second common portion disposed in a same layer as the first common portion, and an uneven portion disposed between the first common portion and the second common portion.

In yet still another embodiment, the present disclosure provides a display device, which includes the abovementioned display panel.

BRIEF DESCRIPTION OF DRAWINGS

Embodiments of the present disclosure are illustrated by the accompanying drawings as follows.

FIG. 17 is a schematic diagram of yet still another display panel according to an embodiment of the present disclosure;

FIG. 18 is a schematic flow chart of a method for manufacturing a display panel according to an embodiment of the present disclosure;

FIG. 19 is a schematic flow chart of a method for manufacturing another display panel according to an embodiment of the present disclosure;

DESCRIPTION OF EMBODIMENTS

Embodiments of the present disclosure will be described in detail as follows with reference to the accompanying drawings.

It should be noted that, the described embodiments are merely exemplary embodiments of the present disclosure, which shall not be interpreted as providing limitations to the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

It should be understood that although a common layer may be described using the terms of "first", "second", "third" etc., in the embodiments of the present disclosure, the common layer will not be limited to these terms. These terms are merely used to distinguish common layers from one another. For example, without departing from the scope of the embodiments of the present disclosure, a first common portion may also be referred to as a second common portion, and similarly, a second common portion may also be referred to as a first common portion.

In the related art, generally a cutting process is adopted to remove the part of the display panel where the camera needs to be placed, so as to form a display panel including a hollow region, such that a device such as a camera can be disposed in the hollow region. However, since a shape of the camera is usually irregular, cutting difficulty of the display panel is increased. Moreover, for the OLED display, after the display panel is cut, it inevitably brings material residues, and the residues will affect the reliability of the subsequent packaging of the display panel.

Figure 1:
FIG. 1 is a schematic diagram of a display panel in the related art.

FIG. 1 is a schematic diagram of a display panel in the related art. In the related art, a cutting process is generally adopted to remove a part of the display panel where a camera is to be placed, so as to form a display panel including a hollow region as shown in FIG. 1, in which a device such as a camera can be disposed. However, since a shape of the camera is usually irregular, cutting difficulty of the display panel is increased. Moreover, for an OLED display, after the display panel is cut, material residues would inevitably occur, which may affect reliability of subsequent packaging of the display panel.

Figure 2:
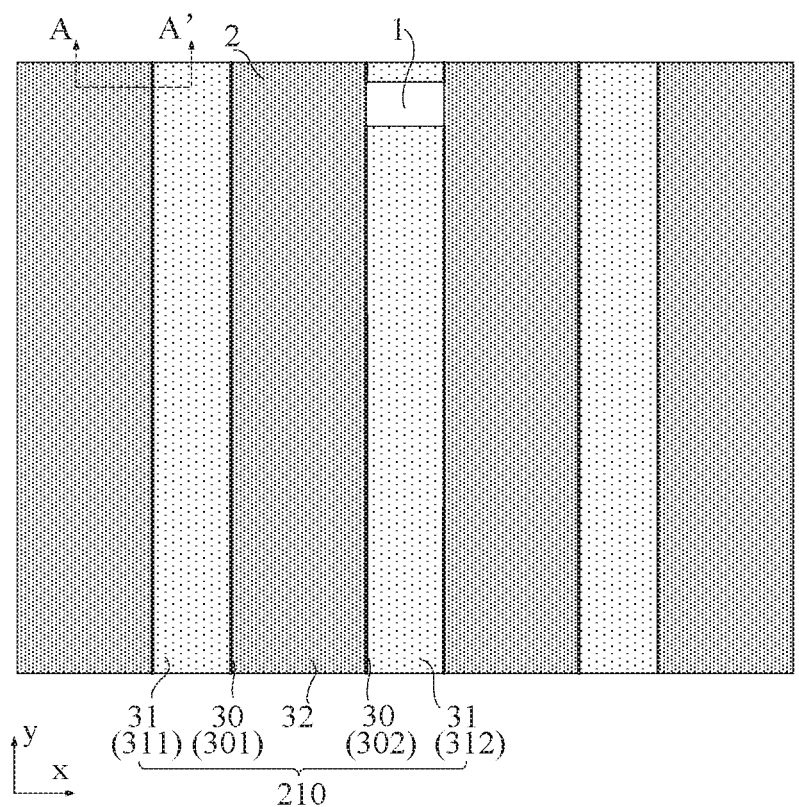
FIG. 2 is a schematic diagram of a display panel according to an embodiment of the present disclosure.
Figure 14:
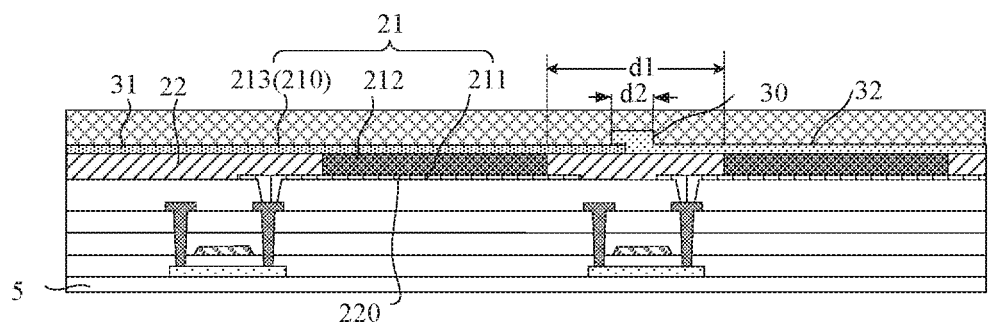
FIG. 14 is a schematic cross-sectional view along line AA' of FIG. 2.

An embodiment of the present disclosure provides a display panel. FIG. 2 is a schematic diagram of a display panel according to an embodiment of the present disclosure, and FIG. 14 is a schematic cross-sectional view along line AA' of FIG. 2. As shown in FIG. 2 and FIG. 14, the display panel has a hollow region 1 and a display region 2 surrounding the hollow region 1. A plurality of light-emitting devices 21 is provided in the display region 2, and includes a common layer 210, and no common layer 210 is formed in the hollow region 1.

As shown in FIG. 2, the common layer 210 includes a first common portion 31 and a second common portion 32 (filling with a different pattern in the figure represents a different common layer), and the first common portion 31 and the second common portion 32 are disposed in a same layer. The common layer 210 further includes an uneven portion 30 located between the first common portion 31 and the second common portion 32.

Figure 3:
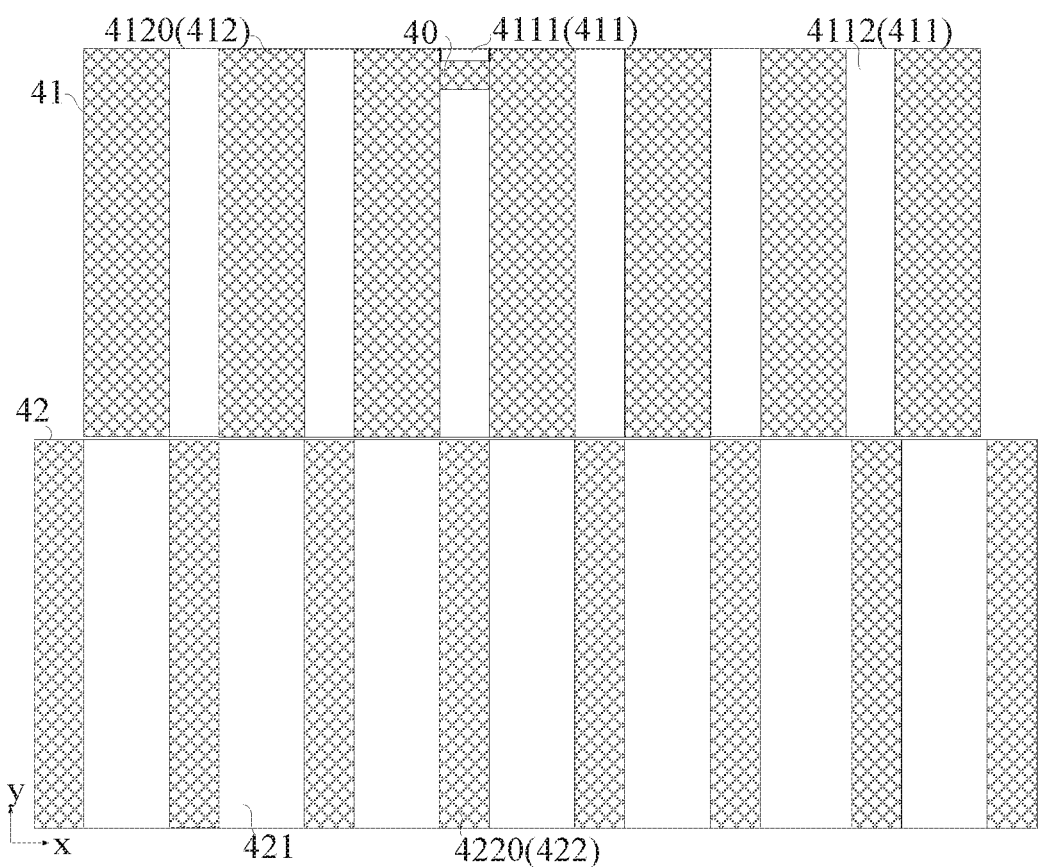
FIG. 3 is a schematic diagram of a mask according to an embodiment of the present disclosure.

When manufacturing the display panel as shown in FIG. 2, for example, the common layer 210, which includes the first common portion 31, the second common portion 32 and the uneven portion 30, can be formed by performing evaporation twice using a mask as shown in FIG. 3, which is a schematic diagram of a mask according to an embodiment of the present disclosure. As shown in FIG. 3, the mask includes a main mask 41 and an auxiliary mask 42. The main mask 41 has aperture regions 411 and shielding regions 412, and the aperture regions 411 and the shielding regions 412 are alternately arranged along a first direction x. The aperture regions 411 of the main mask 41 include a first aperture region 4111 and a second aperture region 4112. The first aperture region 4111 of the main mask 41 is provided with a shielding block 40. A width of the shielding block 40 in the first direction is equal to a width of the first aperture region 4111 in the first direction x. The shielding region 412 of the main mask 41 is provided with a shielding strip 4120 extending along a second direction y.

The auxiliary mask 42 has aperture regions 421 and shielding regions 422, and the aperture regions 421 and the shielding regions 422 are alternately arranged along the first direction x. The shielding region 422 of the auxiliary mask 42 is provided with a shielding strip 4220 extending along the second direction y. The shielding strip 4120 of the main mask 41 has a same shape and a same area as the aperture region 421 of the auxiliary mask 42. The shielding strip 4220 of the auxiliary mask 42 has a same shape and a same area as the second aperture region 4112 of the main mask 41.

Figure 4:
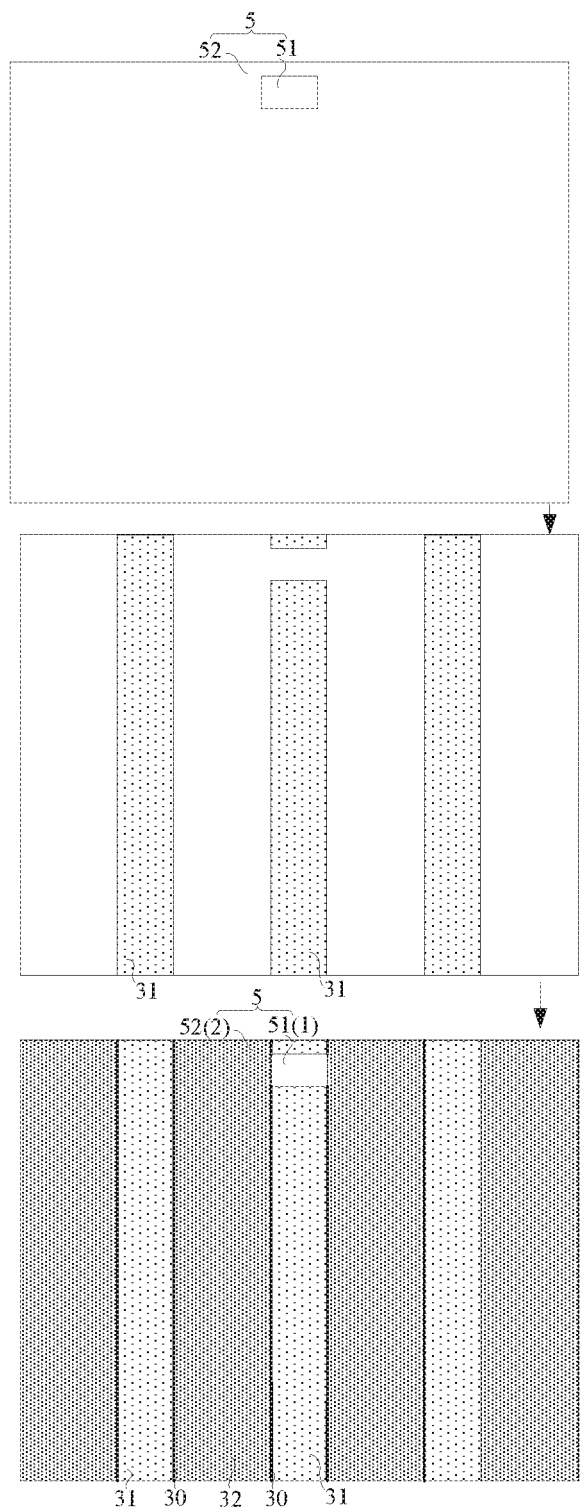
FIG. 4 is a schematic diagram illustrating a process of manufacturing a display panel according to an embodiment of the present disclosure.

In this way, when manufacturing the display panel shown in FIG. 2, a manufacturing method shown in FIG. 4 can be adopted. FIG. 4 is a schematic diagram illustrating a process of manufacturing a display panel according to the embodiment of the present disclosure. First, a base substrate 5 and the mask as shown in FIG. 3 are provided. The base substrate 5 has a non-vapor-deposition region 51 and a vapor-deposition region 52 surrounding the non-vapor-deposition region 51. Next, vapor deposition is performed in the vapor-deposition region 52 using the main mask 41 and the auxiliary mask 42 as shown in FIG. 3. In one embodiment, a first common portion 31 is formed in the vapor-deposition region 52 by vapor deposition through the first aperture region 4111 and the second aperture region 4112 of the main mask 41 as shown in FIG. 3; next, the first common portion 31 and the non-vapor-deposition region 51 are covered by the shielding strip 4220 of the auxiliary mask 42 as shown in FIG. 3, a second common portion 32 is formed in the vapor-deposition region 52 by vapor deposition through the aperture region 421 of the auxiliary mask 42, and an uneven portion is formed between the first common portion 31 and the second common portion 32. In this way, the manufacturing of the common layer 210 covering the vapor-deposition region 52 can be completed in such a manner that the vapor-deposition region 52 forms the display region 2 of the display panel as described above, and a design with no common layer 210 formed in the non-vapor-deposition region 51 can be achieved in such a manner that the non-vapor-deposition region 51 forms the hollow region 1 as described above. Then, a device such as a camera, a microphone or a speaker can be disposed in the hollow region 1, thereby enriching functions of use of the display panel.

According to the above analysis, for the display panel provided by this embodiment of the present disclosure, a hollow region 1 and a display region 2 surrounding the hollow region 1 are provided in the display panel, and a common layer 210 is arranged in the display region 2 while no common layer 210 is arranged in the hollow region 1, which can prevent the common layer 210 from affecting light transmittance of the hollow region 1 in this way, a light-sensing device such as a camera, a light sensor, a depth sensor, and an iris identification sensor can be disposed in the hollow region 1 to enrich functions of use of the display panel.

Moreover, in this embodiment of the present disclosure, an uneven portion 30 is disposed in the common layer 210 of the display panel, so that when manufacturing the display panel, the display region 2 of the display panel can be divided into at least two parts. Then, a first common portion 31 and a second common portion 32 can be sequentially deposited at the parts by at least two vapor deposition processes using the mask as shown in FIG. 3, and an uneven portion 30 is formed between the first common portion 31 and the second common portion, such that the common layer 210 formed by the first common portion 31, the second common portion 32 and the uneven portion 30 can cover the entire display region 2 while no common region 210 is disposed in the hollow region 1. In this way, when manufacturing the display panel including the hollow region 1, there is no need to perform cutting operation on the display panel, thereby avoiding cutting residues and thus achieving reliable packaging of the display panel. Moreover, by a corresponding design of the shape of the mask, it is also possible to manufacture a display panel including a hollow region 1 having various shapes, which can greatly reduce the process difficulty of manufacturing the display panel including the hollow region 1.

In addition, when the display panel performs displaying, carriers generated in the light-emitting device move toward the light-emitting layer through the transfer of the common layer 210, such that the light-emitting layer emits light and the display panel performs displaying. Based on this, in this embodiment of the present disclosure, the uneven portion 30 is provided between the first common portion 31 and the second common portion 32, so that mutual crosstalk of carriers in different display regions can be avoided. That is, with the uneven portion 30, carriers can be confined inside the corresponding light-emitting device, thereby avoiding crosstalk of displayed images at different positions in the display region 2.

In an example, with further reference to FIG. 2, the first common portion 31 and the second common portion 32 extend along the second direction y and are alternately arranged along the first direction x. An uneven portion 30 is formed between any adjacent first common portion 31 and second common portion 32, such that uneven portions 30 are evenly distributed on the display panel.

In an embodiment, as shown in FIG. 2, the first common portion 31 includes a plurality of first common sub-portions 311 and at least one second common sub-portion 312, and uneven portions 30 include a plurality of first uneven portions 301 and at least one second uneven portion 302. Each of the second common sub-portion 312 and the second uneven portion 302 is divided into at least two parts by the hollow region 1. The first uneven portion 301 is located between the second common portion 32 and the first common sub-portion 311. The second uneven portion 302 is located between the second common portion 32 and the second common sub-portion 312. That is, in this embodiment of the present disclosure, the hollow region 1 is arranged in the second common sub-portion 312, such that the common layer 210 can be arranged around the hollow region 1, so as to achieve that no common layer 210 is arranged in the hollow region 1.

Figure 5:
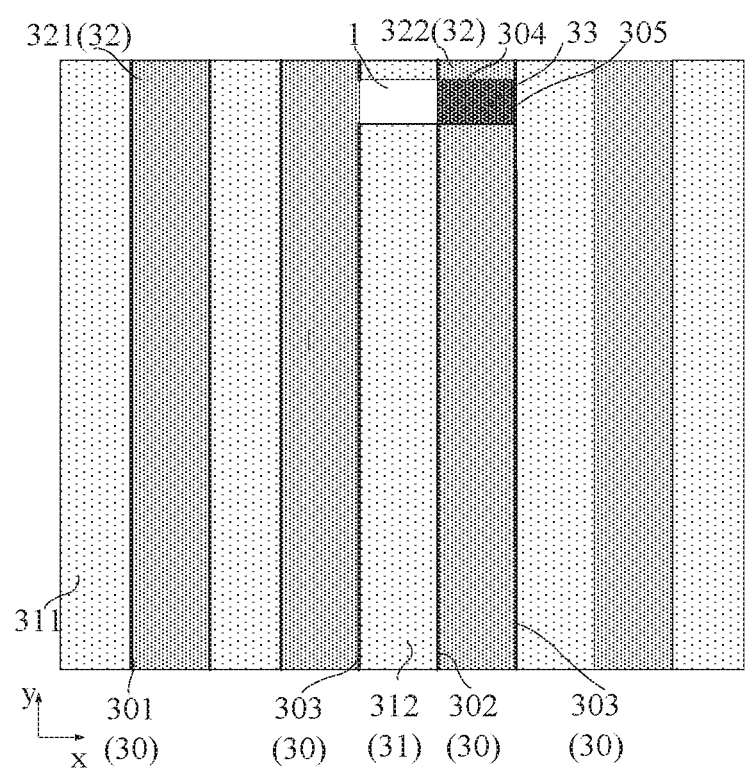
FIG. 5 is a schematic diagram of another display panel according to an embodiment of the present disclosure.
Figure 8:
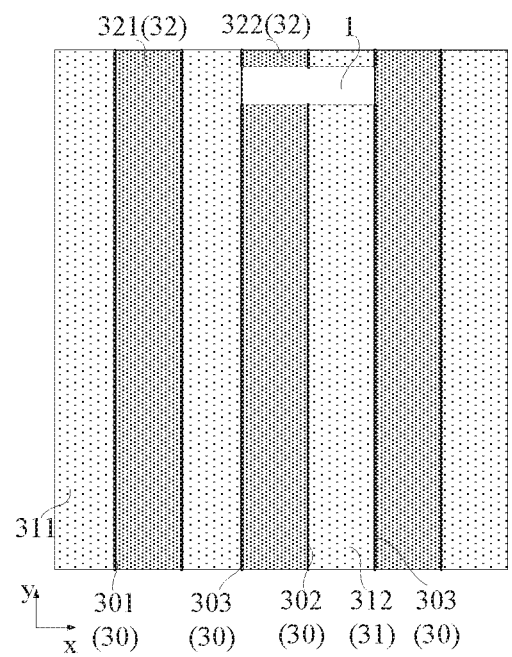
FIG. 8 is a schematic diagram of still another display panel according to an embodiment of the present disclosure.

The first common portion 31 and the second common portion 32 may have various shapes and sizes. For example, as shown in FIG. 2, a width of the first common portion 31 is not equal to a width of the second common portion 32 in the first direction x. As shown in FIG. 5 and FIG. 8, the width of the first common portion 31 is equal to the width of the second common portion 32 in the first direction x. Here, FIG. 5 and FIG. 8 are each a schematic diagram of another display panel according to an embodiment of the present disclosure.

As shown in FIG. 2, when the width of the first common portion 31 is not equal to the width of the second common portion 32 in the first direction x, the common layer 210 covering the display region 2 can be formed by performing vapor deposition twice using the mask as shown in FIG. 3. In this case, the shape and size of the hollow region 1 can be designed variously based on the shape and size of the selected mask, as long as the hollow region 1 is surrounded by the display region 2.

In addition, as shown in FIG. 5 and FIG. 8, the width of the first common portion 31 is equal to the width of the second common portion 32 in the first direction x. The second common portion 32 includes a third common sub-portion 321 and a fourth common sub-portion 322. The third common sub-portion 321, the first common sub-portion 311 and the first uneven portion 301 have a same length in the second direction y. The sum of the length of the fourth common sub-portion 322 and the length of the hollow region 1 is equal to the length of the third common sub-portion 321 in the second direction y. The sum of the length of the second common sub-portion 312 and the length of the hollow region 1 is equal to the length of the third common sub-portion 321 in the second direction y. The uneven portion 30 further includes a third uneven portion 303. The first uneven portion 301 is located between the first common sub-portion 311 and the third common sub-portion 321, the second uneven portion 302 is located between the second common sub-portion 312 and the fourth common sub-portion 322, and the third uneven portion 303 is located between the first common sub-portion 311 and the fourth common sub-portion 322 and between the second common sub-portion 312 and the third common sub-portion 321.

When the width of the first common portion 31 is equal to the width of the second common portion 32, the size of the hollow region 1 may be set as follows. As shown in FIG. 5, the width of the hollow region 1 is equal to the width of the second common sub-portion 312. As shown in FIG. 8, the width of the hollow region 1 is equal to the sum of the width of the first common portion 31 and the width of the second common portion 32. Details will be described in the following.

As shown in FIG. 5, when the width of the hollow region 1 is equal to the width of the second common sub-portion 312, the common layer further includes a third common portion 33, and the third common portion 33 and the second common portion 32 are disposed in a same layer. The uneven portions 30 further include a fourth uneven portion 304 and a fifth uneven portion 305. The fourth uneven portion 304 is located between the fourth common sub-portion 322 and the third common layer 33. The fifth uneven portion 305 is located between the first common sub-portion 311 and the third common portion 33. The hollow region 1, the third common portion 33, and the first common portion 31 have a same width in the first direction x.

Figure 6:
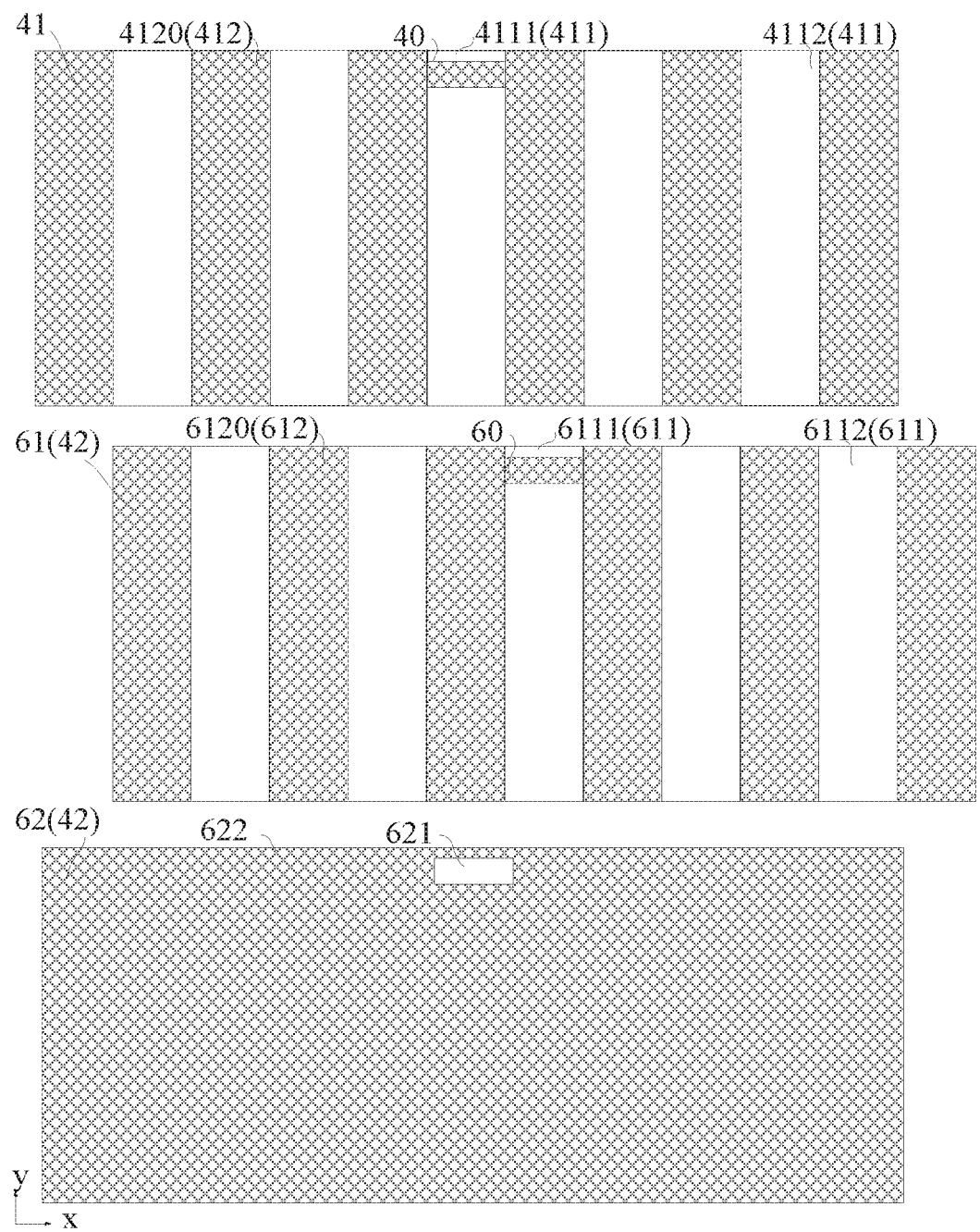
FIG. 6 is a schematic diagram of another mask according to an embodiment of the present disclosure.

When manufacturing the display panel shown in FIG. 5, for example, the mask as shown in FIG. 6 can be adopted to form the common layer 210 as shown in FIG. 5 by vapor deposition. Here, FIG. 6 is a schematic diagram of another mask according to an embodiment of the present disclosure. On the basis of the main mask shown in FIG. 3, the width of the aperture region 411 of the main mask 41 may be set to be equal to the width of the shielding region 412 of the main mask 41 along the first direction x, and the auxiliary masks 42 include a first mask 61 and a second mask 62, so as to form the masks as shown in FIG. 6.

As shown in FIG. 6, the first mask 61 has a same shape and a same area as the main mask 41. The first mask 61 includes aperture regions 611 and shielding regions 612, and the aperture regions 611 and the shielding regions 612 are alternately arranged along the first direction x. The aperture regions 611 of the first mask 61 include a first aperture region 6111 and a second aperture region 6112. The first aperture region 6111 of the first mask 61 is provided with a shielding block 60. A width of the shielding block 60 in the first direction x is equal to a width of the first aperture region 6111 in the first direction x. The shielding region 612 of the first mask 61 is provided with a shielding strip 6120 extending along the second direction y. The second mask 62 includes an aperture region 621 and a shielding region 622. The shielding region 622 of the second mask 62 surrounds the aperture region 621. The aperture region 621 has a same shape and a same area as the shielding block 60 of the first mask 61.

Figure 7:
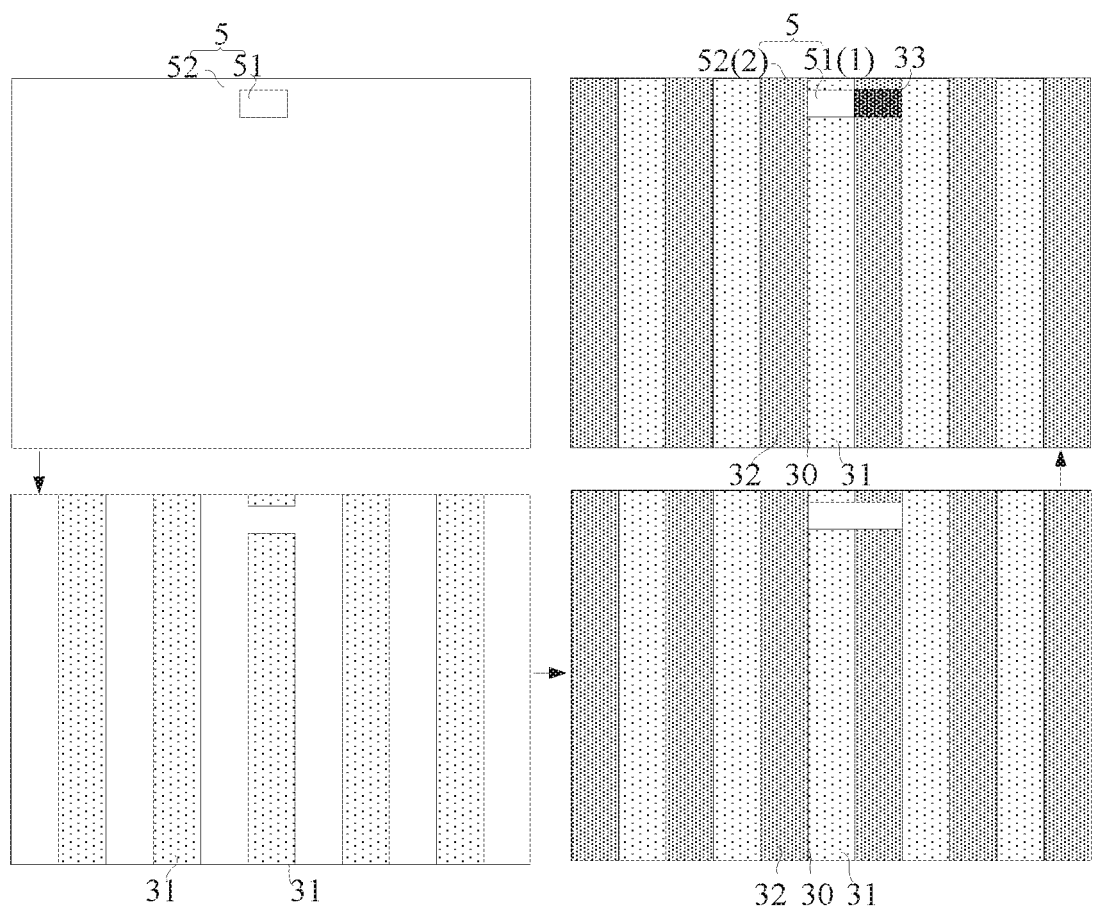
FIG. 7 is a schematic diagram illustrating a manufacturing process of another display panel according to an embodiment of the present disclosure.

On the basis of the mask shown in FIG. 6, when manufacturing the display panel shown in FIG. 5, a manufacturing method as shown in FIG. 7 can be adopted. Here, FIG. 7 is a schematic diagram illustrating a manufacturing process of another display panel according to an embodiment of the present disclosure. First, a base substrate 5 as shown in FIG. 4 and the mask as shown in FIG. 6 are provided; then, a first common portion 31 is formed in a vapor-deposition region 52 by vapor deposition through the first aperture region 4111 and the second aperture region 4112 of the main mask 41 as shown in FIG. 6; then, the first common portion 31 and a non-vapor-deposition region 51 are covered by the shielding strip 6120 of the first mask 61 as shown in FIG. 6, and a second common portion 32 is formed in the vapor-deposition region 52 by vapor deposition through the first aperture region 6111 and the second aperture region 6112 of the first mask 61; then, the first common portion 31, the second common portion 32 and the non-vapor-deposition region 51 are covered by the shielding region 622 of the second mask 62, and a third common portion 33 is formed in the vapor-deposition region 52 by vapor deposition through the aperture region 621 of the second mask; and uneven portions 30 are formed between the second common portion 32 and the first common portion 31 and between the third common portion 33 and the second common portion 32. In this way, the manufacturing of the common layer 210 of the display panel as shown in FIG. 5 can be completed in such a manner that the vapor-deposition region 52 forms the display region 2 of the display panel as described above. Moreover, a design with no common layer 210 formed in the non-vapor-deposition region 51 can be achieved in such a manner that the non-vapor-deposition region 51 forms the hollow region 1 as described above.

In an example, when manufacturing the display panel as shown in FIG. 5, after the first common portion 31 is formed in the vapor-deposition region 52 through the aperture regions 411 of the main mask 41 as shown in FIG. 6, the main mask 41 as shown in FIG. 6 can be translated by a first distance along the first direction x. The first distance is equal to the width of the shielding block 40. In this way, the main mask 41 can be reused as the first mask 61, that is, the second common portion 32 can be formed in the vapor-deposition region 51 by continuing with vapor deposition through the aperture regions 411 of the translated main mask 41, so as to reduce the number of masks.

Figure 9:
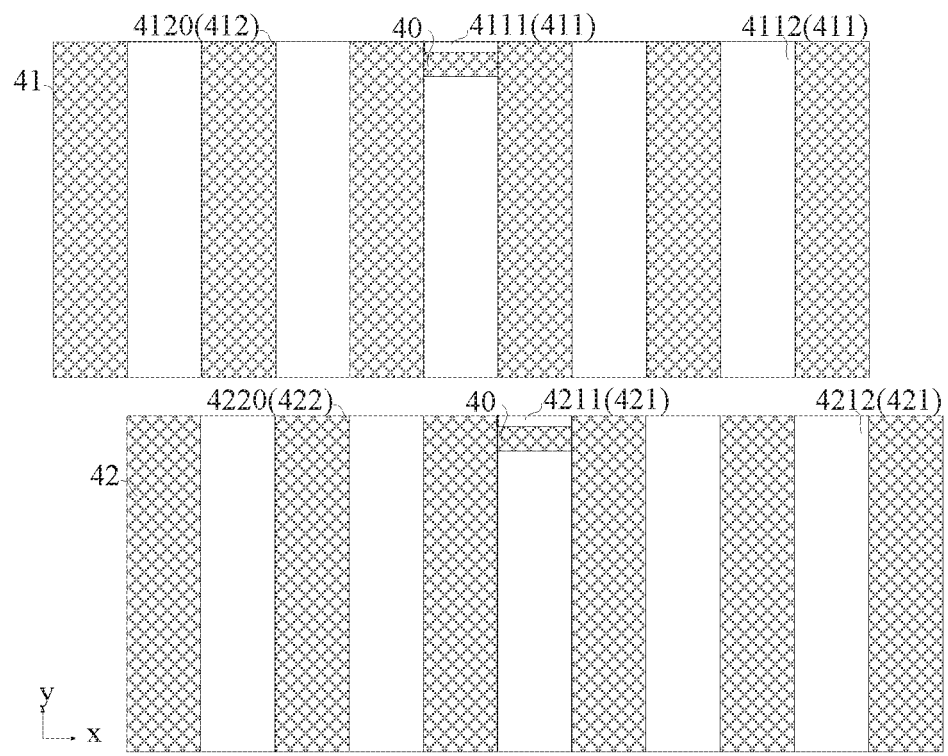
FIG. 9 is a schematic diagram of still another mask according to an embodiment of the present disclosure.

As shown in FIG. 8, when the width of the hollow region 1 is equal to the sum of the width of the first common portion 31 and the width the second common portion 32 in the first direction x, for example, the common layer 210 as shown in FIG. 8 can be formed by vapor deposition through the mask as shown in FIG. 9. Here, FIG. 9 is a schematic diagram of still another mask according to an embodiment of the present disclosure. On the basis of the main mask shown in FIG. 3, along the first direction x, the width of the aperture region 411 of the main mask 41 as shown in FIG. 3 is set to be equal to the width of the shielding region 412 of the main mask 41 as shown in FIG. 3, and the shape and area of the auxiliary mask 42 are set to be the same as those of the main mask 41. In this way, the mask as shown in FIG. 9 is formed.

As shown in FIG. 9, the mask includes a main mask 41 and an auxiliary mask 42. The main mask 41 includes aperture regions 411 and shielding regions 412, and the aperture regions 411 and the shielding regions 412 are alternately arranged along the first direction x. A width of the aperture region 411 is equal to a width of the shielding region 412. The aperture regions 411 of the main mask 41 include a first aperture region 4111 and a second aperture region 4112. The first aperture region 4111 of the main mask 41 is provided with a shielding block 40. A width of the shielding block 40 in the first direction x is equal to a width of the first aperture region 4111 in the first direction x. The shielding region 412 of the main mask 41 is provided with a shielding strip 4120 extending along the second direction y.

The auxiliary mask 42 includes aperture regions 421 and shielding regions 421, and the aperture regions 421 and shielding regions 421 are alternately arranged along the first direction x. A width of the aperture region 421 is equal to a width of the shielding region 422. The aperture regions 421 of the auxiliary mask 42 include a first aperture region 4211 and a second aperture region 4212. The first aperture region 4211 of the auxiliary mask 42 is provided with a shielding block 40. A width of the shielding block 40 in the first direction x is equal to a width of the first aperture region 4211 in the first direction x. The shielding region 422 is provided with a shielding strip 4220 extending along the second direction y. The shielding strip 4120 of the main mask 41 has a same shape and a same area as the aperture region 421 of the auxiliary mask 42. The shielding strip 4220 of the auxiliary mask 42 has a same shape and a same area as the second aperture region 4112 of the main mask 41.

Figure 10:
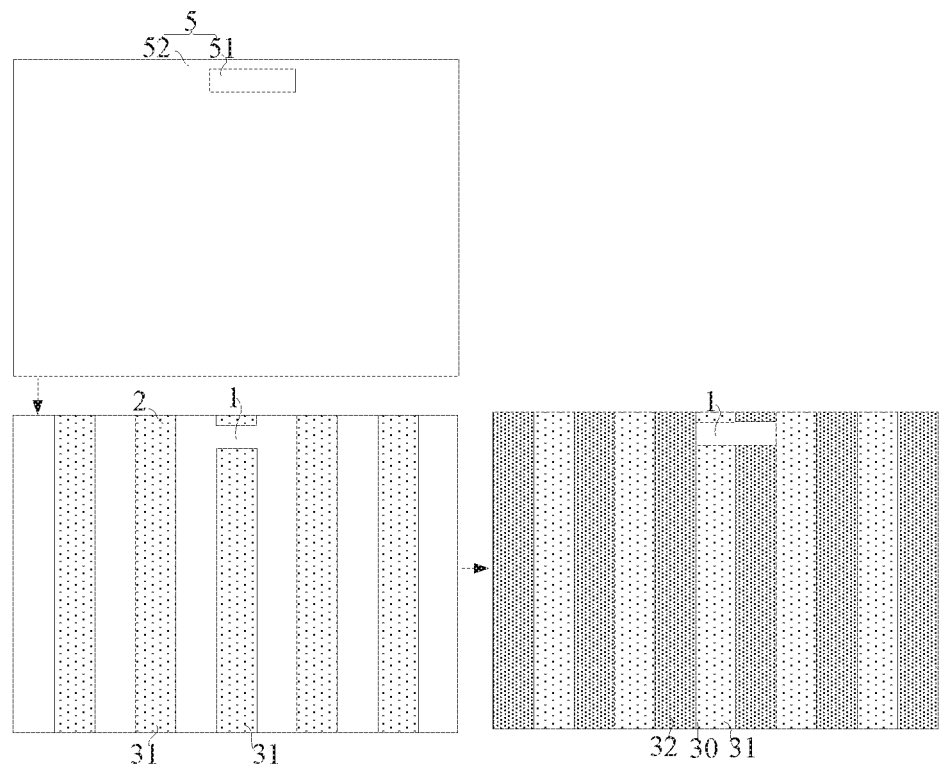
FIG. 10 is a schematic diagram illustrating a manufacturing process of still another display panel according to an embodiment of the present disclosure.

On the basis of the masks as shown in FIG. 9, when manufacturing the display panel as shown in FIG. 8, a manufacturing method as shown in FIG. 10 can be adopted. Here, FIG. 10 is a schematic diagram illustrating a manufacturing process of still another display panel according to an embodiment of the present disclosure. First, a base substrate 5 as shown in FIG. 4 and the mask as shown in FIG. 9 are provided, and then, a first common portion 31 is formed in a vapor-deposition region 52 by vapor deposition through the first aperture region 4111 and the second aperture region 4112 of the main mask 41 as shown in FIG. 9; and then, the first common portion 31 and a non-vapor-deposition region 51 are covered by the shielding regions 422 of the auxiliary mask 42 as shown in FIG. 9, and a second common portion 32 is formed in the vapor-deposition region 52 by vapor deposition through the first aperture region 4211 and the second aperture region 4212 of the auxiliary mask 42. In this way, the manufacturing of the common layer 210 of the display panel as shown in FIG. 8 can be completed in such a manner that the vapor-deposition region 52 of the display panel forms the display region 2 of the display panel as described above. Moreover, a design with no common layer 210 formed in the non-vapor-deposition region 51 can be achieved in such a manner that the non-vapor-deposition region 51 forms the hollow region 1 as described above.

In an example, when manufacturing the display panel as shown in FIG. 9, since the auxiliary mask 42 has a same shape and a sane area as the main mask 41, after the first common portion 31 is formed in the vapor-deposition region 52 through the aperture regions 411 of the main mask 41 as shown in FIG. 9, the main mask as shown in FIG. 9 can be translated by a first distance along the first direction x. The first distance is equal to the width of the shielding block 40. In this way, the main mask 41 can be reused as the auxiliary mask 42, that is, the second common portion 32 is formed in the vapor-deposition region 51 by continuing with vapor deposition through the aperture regions 411 of the translated main mask 41. In this way, the main mask 41 can be used twice, and thus the number of masks can be reduced.

Figure 11:
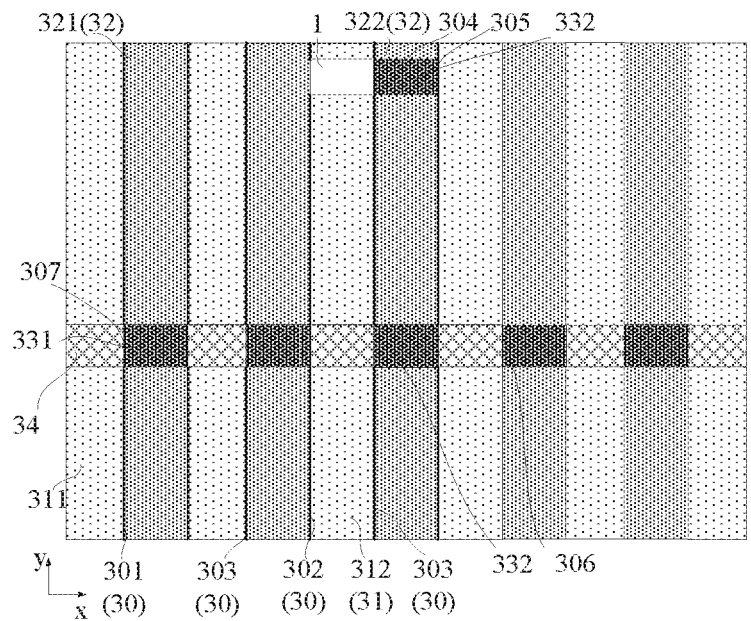
FIG. 11 is a schematic diagram of yet still another display panel according to an embodiment of the present disclosure.

In addition to the display panel with the structure shown in FIG. 2, FIG. 5 and FIG. 8, an embodiment of the present disclosure further provides a display panel. FIG. 11 is a schematic diagram of yet still another display panel according to an embodiment of the present disclosure. As shown in FIG. 11, the common layer 210 further includes a fourth common portion 34. The fourth common portion 34 and the second common portion 32 are disposed in a same layer. The third common portion 33 includes a fifth common sub-portion 331 and a sixth common sub-portion 332. The fifth common sub-portion 331 divides the third common sub-portion 321 into at least two parts along the second direction y. The sixth common sub-portion 332 divides the fourth common sub-portion 322 into at least two parts along the second direction y. The uneven portions 30 further include a sixth uneven portion 306 and a seventh uneven portion 307.

The fourth uneven portion 304 is located between the sixth common sub-portion 332 and the fourth common sub-portion 322. The fifth uneven portion 305 is located between the sixth common sub-portion 332 and the first common sub-portion 311. The sixth uneven portion 306 is located between the fifth common sub-portion 331 and the fourth common portion 34. The seventh uneven portion 307 is located between the fourth common portion 34 and the second common portion 32. A width of the fourth common portion 34 in the first direction x is equal to a width of the third common portion 33 in the first direction x.

Figure 12:
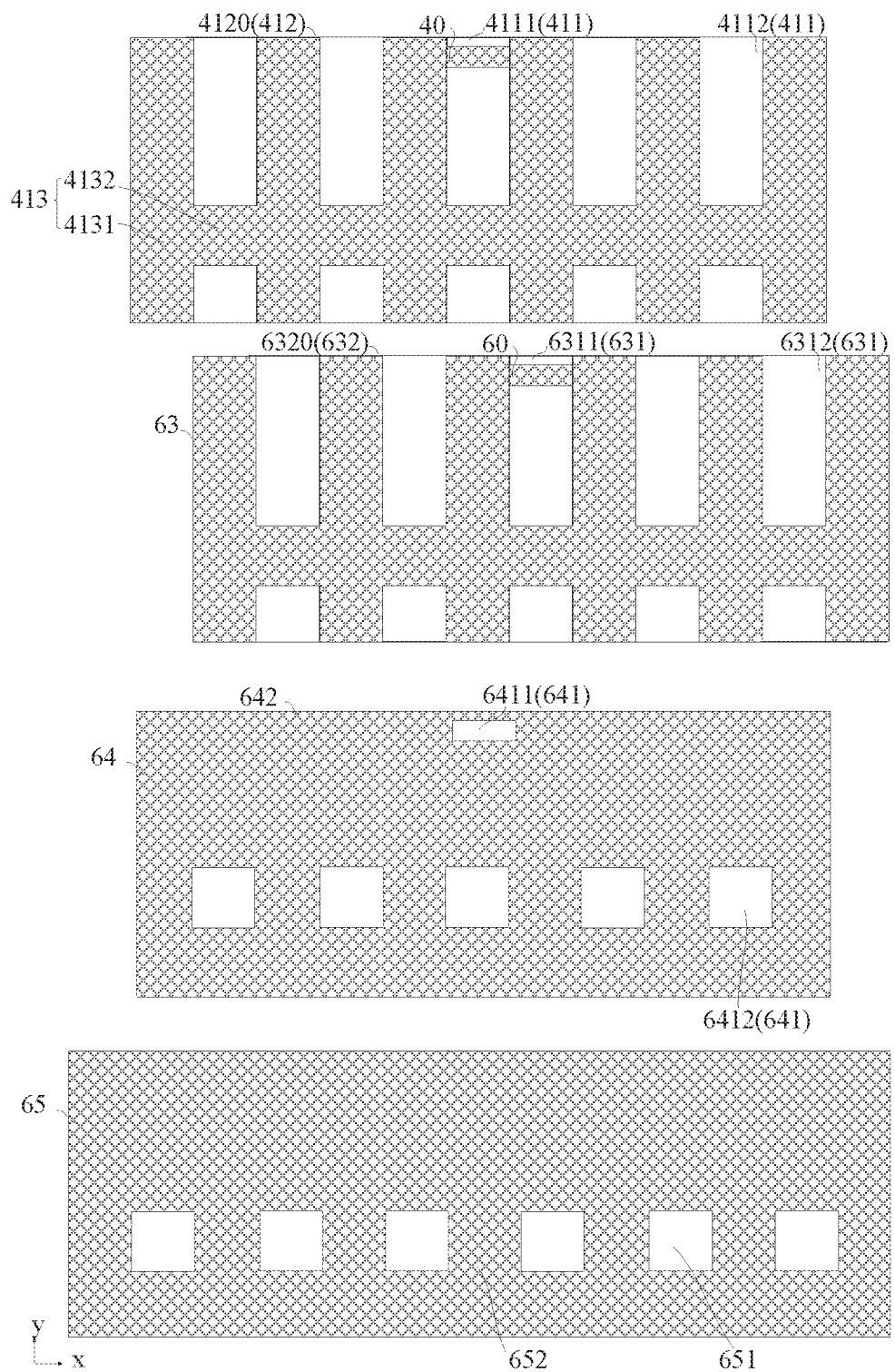
FIG. 12 is a schematic diagram of yet still another mask according to an embodiment of the present disclosure.

When manufacturing the display panel as shown in FIG. 11, for example, a common layer 210 as shown in FIG. 11 can be formed by vapor deposition through masks as shown in FIG. 12. Here, FIG. 12 is a schematic diagram of yet still another mask according to an embodiment of the present disclosure. On the basis of the main mask as shown in FIG. 3, the main mask may be provided with a supporting strip 413 extending along the first direction x. The supporting strip 413 does not overlap with the shielding block 40. The supporting strip 413 includes an overlapping portion 4131 and a non-overlapping portion 4132. The overlapping portion 4131 overlaps with the shielding strip 4120, and the non-overlapping portion 4132 does not overlap with the shielding strip 4120. The auxiliary masks 42 include a third mask 63, a fourth mask 64, and a fifth mask 65. The third mask 63 has a same shape and a same area as the main mask 41 shown in FIG. 12. The third mask 63 includes aperture regions 631 and shielding regions 632 that are alternately arranged along the first direction x. The aperture regions 631 of the third mask 63 include a first aperture region 6311 and a second aperture region 6312. A shielding block 60 is arranged in the first aperture region 6311 of the third mask 63. A width of the shielding block 60 in the first direction x is equal to a width of the first aperture region 6111 in the first direction x. A shielding strip 6320 extending along the second direction y is arranged in the shielding region 632 of the third mask 63. The fourth mask 64 includes aperture regions 641 and a shielding region 642. The shielding region 642 surrounds the aperture regions 641. The aperture regions 641 include a first aperture region 6411 and a second aperture region 6412. The first aperture region 6411 of the fourth mask 64 has a same shape and a same area as the shielding block 40, and the second aperture region 6412 of the fourth mask 64 has a same shape and a same area as the non-overlapping portion 4132 of the main mask 41. The fifth mask 65 includes aperture regions 651 and a shielding region 652. The shielding region 652 surrounds the aperture regions 651. The aperture region 651 has a same shape and a same area as the overlapping portion 4131 of the main mask 41.

Figure 13:
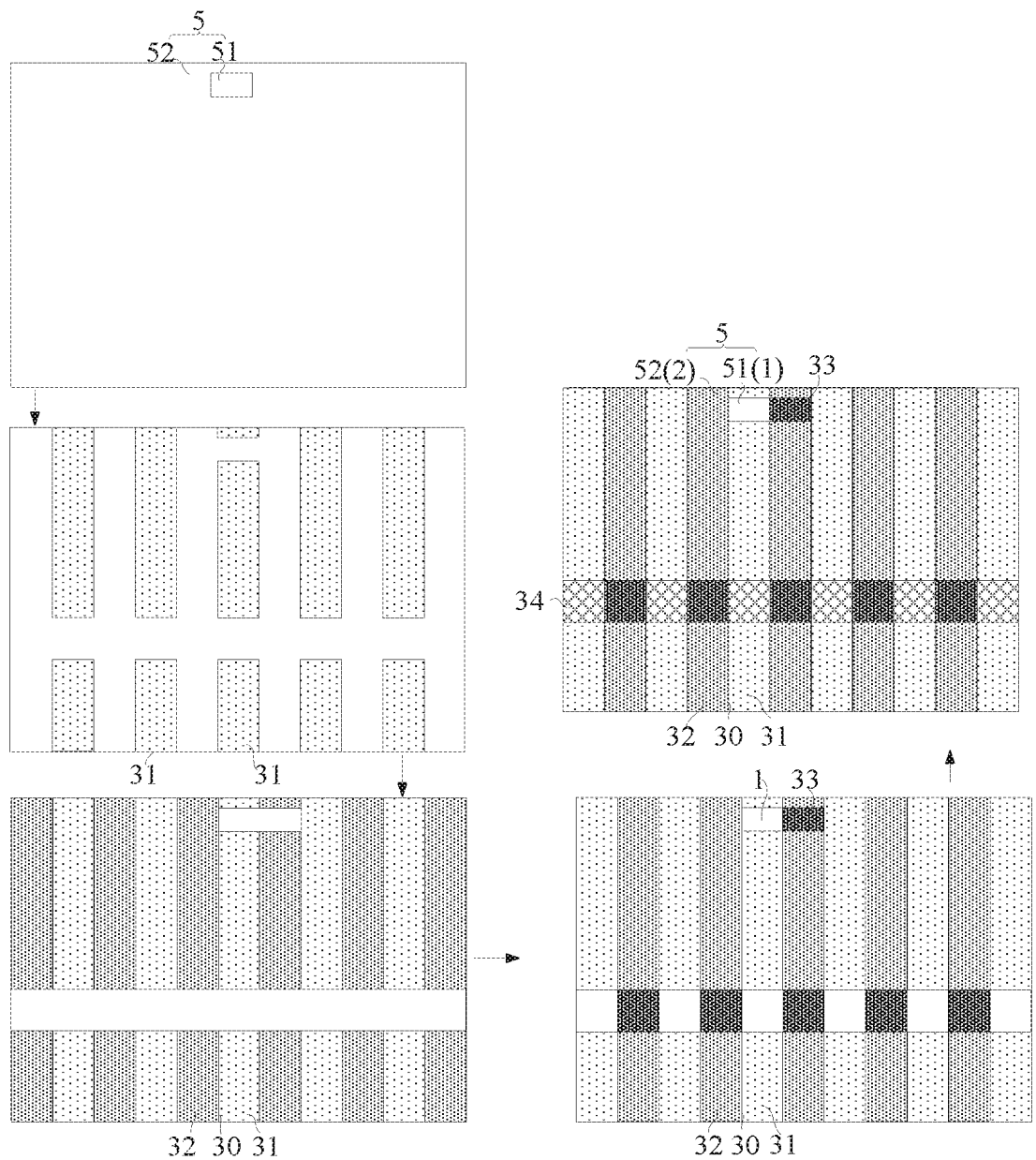
FIG. 13 is a schematic diagram illustrating a manufacturing process of yet still another display panel according to an embodiment of the present disclosure.

On the basis of the mask as shown in FIG. 12, when manufacturing the display panel as shown in FIG. 11, a manufacturing method as shown in FIG. 13 can be used. Here, FIG. 13 is a schematic diagram illustrating a manufacturing process of yet still another display panel according to an embodiment of the present disclosure. First, a base substrate 5 as shown in FIG. 4 and the mask as shown in FIG. 12 are provided; then, a first common portion 31 is formed in a vapor-deposition region 52 by vapor deposition through the first aperture region 4111 and the second aperture region 4112 of the main mask 41 as shown in FIG. 12;

then, the first common portion 31 and a non-vapor-deposition region 51 are covered using the shielding strip 6320 of the third mask 63, and a second common portion 32 is formed in the vapor-deposition region 52 by vapor deposition through the first aperture region 6311 and the second aperture region 6312 of the third mask 63; then, the first common portion 31, the second common portion 32 and the non-vapor-deposition region 51 are covered using the shielding region 642 of the fourth mask 64, and a third common portion 33 is formed in the vapor-deposition region 52 by vapor deposition through the first aperture region 6411 and the second aperture region 6412 of the fourth mask 64; and the first common portion 31, the second common portion 32, the third common portion 33 and the non-vapor-deposition region 51 are covered using the shielding region 652 of the fifth mask 65, and a fourth common portion 34 is formed in the vapor-deposition region 52 by vapor deposition through the aperture region 651 of the fifth mask 65. The uneven portions are formed between the second common portion 32 and the first common portion 31, between the third common portion 33 and the second common portion 32, between the fourth common portion 34 and the third common portion 33, and between the fourth common portion 34 and the second common portion 32. In this way, manufacturing of the common layer 210 of the display panel as shown in FIG. 11 can be completed, so that the vapor-deposition region 52 of the display panel forms the display region of the display panel as described above. Moreover, no common layer 210 is formed in the non-vapor-deposition region 51, such that the non-vapor-deposition region 51 forms the hollow region 1 as described above.

Moreover, in this embodiment of the present disclosure, the main mask 41 as shown in FIG. 12 is provided with a supporting strip 413, which can support a plurality of shielding strips 4120 of the main mask 41, thereby preventing the main mask 41 from being deformed during the vapor deposition process and thus achieving the vapor deposition integrity of the common layer 210.

It should be understood that in the main mask 41 as shown in FIG. 12, the number of supporting strips 413 is only illustrative, and a plurality of supporting strips 413 may be provided in the actual process. Correspondingly, the shape and structure of the common layer 210 may be variously designed, which will not be further described herein by the embodiments of the present disclosure.

In an example, as shown in FIG. 14, which is a schematic cross-sectional view along line AA' of FIG. 2, the light-emitting device further includes an anode 211, a light-emitting layer 212 and a cathode 213 that are disposed in a stacked manner. The uneven portion 30 does not overlap with the light-emitting layer 212. That is, in this embodiment of the present disclosure, the uneven portion 30 disposed between the first common portion 31 and the second common portion 32 does not overlap with the light-emitting layer 212, so as to avoid an influence on light emitted from the light-emitting layer 212. This can achieve normal light emission of the light-emitting layer 212, thereby achieving the display effect of the display panel including the hollow region 1 provided by this embodiment of the present disclosure.

With further reference to FIG. 14, a pixel definition layer 22 is arranged in the display region, the pixel definition layer 22 includes a plurality of aperture regions 220, and the light-emitting layer 212 is located in the aperture region 220. The uneven portion 30 is disposed between two adjacent aperture regions 220, so as to prevent the uneven portion 30 from affecting normal light emission of the light-emitting layer 212.

As shown in FIG. 14, a distance d1 between two adjacent aperture regions 220 satisfies 15 µm≤d1≤25 µm. In a direction along a line connecting two adjacent aperture regions 220, a length d2 of the uneven portion 30 between the two adjacent aperture regions 220 satisfies 5 µm≤d2≤15 µm, such that the uneven portion 30 can be disposed between two adjacent aperture regions 220, thereby avoiding an influence on light emission of the light-emitting layer 212.

Figure 15:
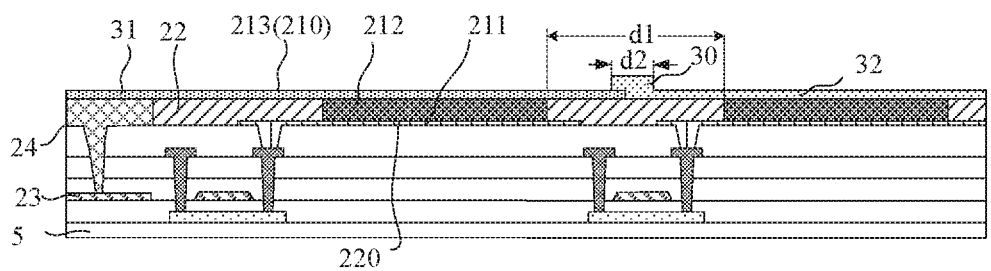
FIG. 15 is a schematic cross-sectional view of another display panel according to an embodiment of the present disclosure.

In an example, as shown in FIG. 15, which is a schematic cross-sectional view of another display panel according to an embodiment of the present disclosure, the common layer 210 can be reused as a cathode 213. In this case, the uneven portion 30 includes a protrusion, and the first common portion 31 overlaps with and contacts the second common portion 32 at the protrusion. The display panel further includes a power trace layer 23 and a connection trace layer 24. The power trace layer 23 is disposed on a side of the anode 211 facing away from the light-emitting layer 212, and the connection trace layer 24 and the anode 211 are disposed in a same layer. The cathode 213 is connected to the power trace layer 23 through the connection trace layer 24. In this way, the cathode 213 can be formed by the abovementioned multiple vapor deposition processes, the cathode 213 is electrically connected to the power trace layer 23 such that the power trace layer 23 can provide a power signal to the cathode 213, and when the first common portion 31 and the second common portion 32 are used as the cathode, a same potential can be received for use in normal operation of the light-emitting device.

Figure 16:
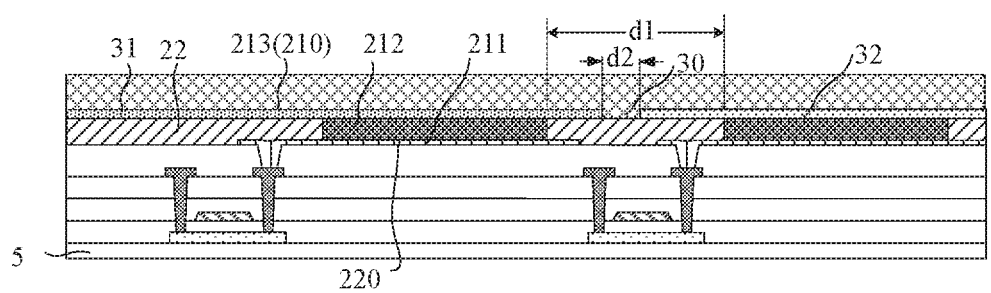
FIG. 16 is a schematic cross-sectional view of still another display panel according to an embodiment of the present disclosure.

In another example, the common layer 210 may be one or more of an electron transport, layer, an electron injection layer, a hole transport layer, and a hole injection layer. In this case, the uneven portion 30 may be formed in various shapes. For example, as shown in FIG. 14, the uneven portions 30 may include a protrusion, and the first common portion 31 overlaps with and contacts the second common portion 32 at the protrusion. As shown in FIG. 16, which is a schematic cross-sectional view of still another display panel according to an embodiment of the present disclosure, the uneven portions 30 include a recess, and the first common portion 31 is separated from the second common portion 32 by the recess.

In another example, for a plurality of uneven portions 30 disposed between the first common portion 31 and the second common portion 32 that are alternately arranged, a part of the uneven portions 30 may be protrusions, and another part of the uneven portions 30 may be recesses, which is not limited by the embodiments of the present disclosure.

In the above FIG. 2, FIG. 5, FIG. 8 and FIG. 11, the hollow region 1 is shaped as a square for illustrative purpose. In other embodiments, the hollow region 1 can also be shaped as a circle, as long as the shape of the mask is adjusted accordingly. As shown in FIG. 17, which is a schematic diagram of yet still another display panel according to an embodiment of the present disclosure, the hollow region 1 is shaped as a circle.

An embodiment of the present disclosure further provides a mask as shown in FIG. 3. The mask includes a main mask 41 and an auxiliary mask 42. The main mask 41 includes aperture regions 411 and shielding regions 412 that are alternately arranged along the first direction x. The aperture regions 411 of the main mask 41 include a first aperture region 4111 and a second aperture region 4112. A shielding block 40 is arranged in the first aperture region 4111 of the main aperture 41. A width of the shielding block 40 in the first direction x is equal to a width of the first aperture region 4111 in the first direction x. A shielding strip 4120 extending along the second direction y is arranged in the shielding region 412 of the main mask 41.

The auxiliary mask 42 includes aperture regions 421 and shielding regions 422 that are alternately arranged along the first direction x. A shielding strip 4220 extending along the second direction y is arranged in the shielding region 422 of the auxiliary mask 42.

The shielding strip 4120 of the main mask 41 has a same shape and a same area as the aperture region 421 of the auxiliary mask 42. The shielding strip 4220 of the auxiliary mask 42 has a same shape and a same area as the second aperture region 4112 of the main mask 41.

In this embodiment of the present disclosure, by setting the mask in the above manner, when manufacturing a display panel using the mask, a display panel including a hollow region can be formed by at least two vapor deposition processes through the main mask and the auxiliary mask, and no common layer is formed in the hollow region. In this way, it can prevent the common layer from affecting light transmittance of the hollow region, so that a light-sensing device such as a camera, a light sensor, a depth sensor, and an iris identification sensor can be placed in the hollow region to enrich functions of use of the display panel.

Moreover, with the mask provided by this embodiment of the present disclosure, when manufacturing the display panel including the hollow region, there is no need to perform cutting operation on the display panel, thereby avoiding cutting residues and thus achieving reliable packaging of the display panel. Moreover, an uneven portion is formed at a junction of aperture regions of the main mask and the auxiliary mask when manufacturing the display panel using the masks, so that mutual crosstalk of carriers in different display regions can be avoided during the displaying process of the manufactured display panel, thereby avoiding crosstalk of displayed images at different positions in the display region.

As shown in FIG. 6, a width of the aperture region 411 of the main mask 41 in the first direction x is equal to a width of the shielding region 412 of the main mask 41 in the first direction x. The auxiliary masks 42 include a first mask 61 and a second mask 62. The first mask 61 has a same shape and a same area as the main mask 41. The second mask 62 includes an aperture region 621 and a shielding region 622, and the shielding region 622 surrounds the aperture region 621. The aperture region 621 has a same shape and a same area as the shielding block 60 of the first mask 61. In this way, the display panel as shown in FIG. 5 can be manufactured.

In another embodiment, as shown in FIG. 9, on the basis that the width of the aperture region 411 of the main mask 41 is equal to the width of the shielding region 412 of the main mask 41, the auxiliary mask 42 can be set to have a same shape and a same area as the main mask 41. In this way, the display panel as shown in FIG. 8 can be manufactured.

In addition, when the width of the aperture region 411 of the mask 41 is equal to the width of the shielding region 412 of the main mask 41 in the first direction x, as shown in FIG. 12, the main mask 41 is provided with a supporting strip 413 extending along the first direction x. The supporting strip 413 does not overlap with the shielding block 40. The supporting strip 413 includes an overlapping portion 4131 and a non-overlapping portion 4132. The overlapping portion 4131 overlaps with the shielding strip 4120 of the main mask 41, and the non-overlapping portion 4132 does not overlap with the shielding strip 4120 of the main mask 41. On the basis of this, the auxiliary masks 42 include a third mask 63, a fourth mask 64, and a fifth mask 65. The third mask 63 has a same shape and a same area as the main mask 41. The fourth mask 64 includes aperture regions 641 and a shielding region 642. The shielding region 642 surrounds the aperture regions 641. The aperture regions 641 of the fourth mask 64 include a first aperture region 6411 and a second aperture region 6412. The first aperture region 6411 of the fourth mask 64 has a same shape and a same area as the shielding block 40, and the second aperture region 6412 of the fourth mask 64 has a same shape and a same area as the non-overlapping portion 4132 of the main mask 41. The fifth mask 65 includes aperture regions 651 and a shielding region 652. The shielding region 652 surrounds the aperture regions 651. The aperture region 651 has a same shape and a same area as the overlapping portion 4131 of the main mask 41. In this way, the display panel as shown in FIG. 11 can be manufactured by sequentially using the main mask 41, the third mask 62, the fourth mask 64 and the fifth mask 65. Moreover, in this embodiment, the main mask 41 is provided with the supporting strip 413 to support the main mask 41, so as to prevent the main mask 41 from being deformed during manufacturing the display panel and thus affecting manufacturing of the common layer 210.

An embodiment of the present disclosure further provides a method for manufacturing a display panel. FIG. 18 is a schematic flow chart of a method for manufacturing a display panel according to an embodiment of the present disclosure. As shown in FIG. 4 and FIG. 18, the method includes following steps.

At step S1, the base substrate 5 and the mask as shown in FIG. 3 are provided. The base substrate 5 includes a non-vapor-deposition region 51 and a vapor-deposition region 52, and the vapor-deposition region 52 surrounds the non-vapor-deposition region 51.

At step S2, a common layer 210 is formed in the vapor-deposition region 52 sequentially by vapor deposition through the main mask 41 and the auxiliary mask 42 as shown in FIG. 3, and no common layer 210 is formed in the non-vapor-deposition region 51. The common layer 210 includes a first common portion 31 and a second common portion 32 that are disposed in a same layer, and the common layer 210 further includes an uneven portion 30 disposed between the first common portion 31 and the second common portion 32.

In this embodiment of the present disclosure, when manufacturing the display panel, the base substrate includes a vapor-deposition region and a non-vapor-deposition region, and then, a common layer is formed in the vapor-deposition region sequentially by vapor deposition through the main mask and the auxiliary mask, and the common layer including the first common portion, the second common portion and the uneven portion can cover the entire vapor-deposition region while no common layer is formed in the non-vapor-deposition region. In this way, the vapor-deposition region provided with the common layer forms the display region of the display panel, and the non-vapor-deposition region provided with no common layer forms the hollow region of the display panel, so as to prevent the common layer from affecting light transmittance of the hollow region, so that a light-sensing device such as a camera, a light sensor, a depth sensor, and an iris identification sensor can be placed in the hollow region to enrich functions of use of the display panel.

Moreover, according to the method for manufacturing the display panel provided by this embodiment of the present disclosure, when manufacturing the display panel including the hollow region, there is no need to perform cutting operation on the display panel, thereby avoiding cutting residues and thus achieving reliable packaging of the display panel. Moreover, by a corresponding design of the shape of the mask, it is also possible to manufacture a display panel including a hollow region having various shapes, which can greatly reduce the process difficulty of manufacturing the display panel including the hollow region.

In addition, when the display panel manufactured by the above method performs displaying, carriers generated in the light-emitting device move toward the light-emitting layer through the transfer of the common layer, such that the light-emitting layer emits light and the display panel performs displaying. Based on this, in this embodiment of the present disclosure, the uneven portion is provided between the first common portion and the second common portion, so that mutual crosstalk of carriers in different display regions can be avoided. That is, with the uneven portion, carriers can be confined inside the corresponding light-emitting device, thereby avoiding crosstalk of displayed images at different positions in the display region.

FIG. 19 is a schematic flow chart of a method for manufacturing another display panel according to an embodiment of the present disclosure. As shown in FIG. 4 and FIG. 19, the abovementioned step S2 of forming the common layer 210 in the vapor-deposition region 52 sequentially by vapor deposition through the main mask 41 and the auxiliary mask 42 includes following steps.

At step S21, a first common portion 31 is formed in the vapor-deposition region 52 by vapor deposition through a first aperture region 4111 and a second aperture region 4112 of a main mask 41.

At step S22, the first common portion 31 and the non-vapor-deposition region 51 are covered using a shielding strip 4220 of an auxiliary mask 42, a second common portion 32 is formed in the vapor-deposition region 52 by vapor deposition through an aperture region 421 of the auxiliary mask 42, and an uneven portion 30 is formed between the first common portion 31 and the second common portion 32.

When manufacturing the display panel, there may be various manufacturing methods depending on different shape requirements of the display panel.

Figure 20:
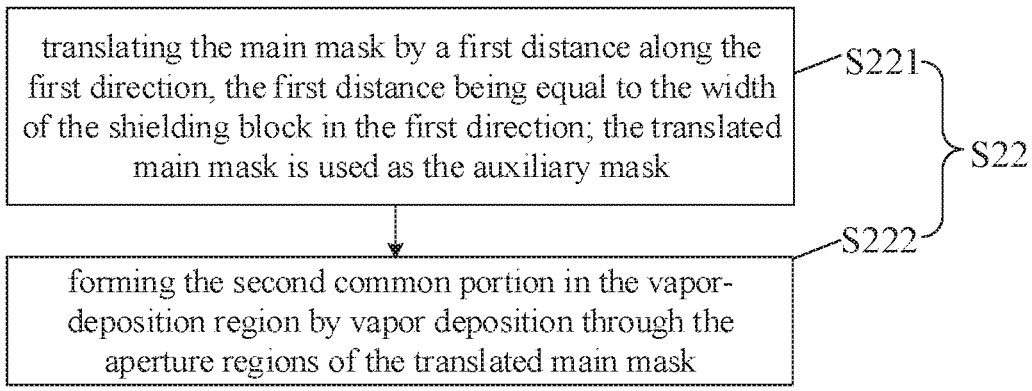
FIG. 20 is a schematic flow chart of a method for manufacturing still another display panel according to an embodiment of the present disclosure.

FIG. 20 is a schematic flow chart of a method for manufacturing still another display panel according to an embodiment of the present disclosure. In an example, as shown in FIG. 8 and FIG. 20, a width of the non-vapor-deposition region 51 in the first direction x is twice a width of the shielding block 40 in the first direction x, a width of the aperture region 411 of the main mask 41 in the first direction x is equal to a width of the shielding region 412 of the main mask 41 in the first direction x. In this case, the abovementioned step S22 of covering the first common portion 31 using the shielding strip 4220 of the auxiliary mask 42 and forming the second common portion 32 in the vapor-deposition region 52 by vapor deposition through the aperture region 421 of the auxiliary mask 42 includes following steps.

At step S221, the main mask 41 is translated by a first distance along a first direction x. The first distance is equal to a width of the shielding block 40 in the first direction x, and the translated main mask 41 is used as an auxiliary mask 42.

At step S222, a second common portion 32 is formed in the vapor-deposition region 52 by vapor deposition through the aperture region 411 of the translated main mask 41.

Figure 21:
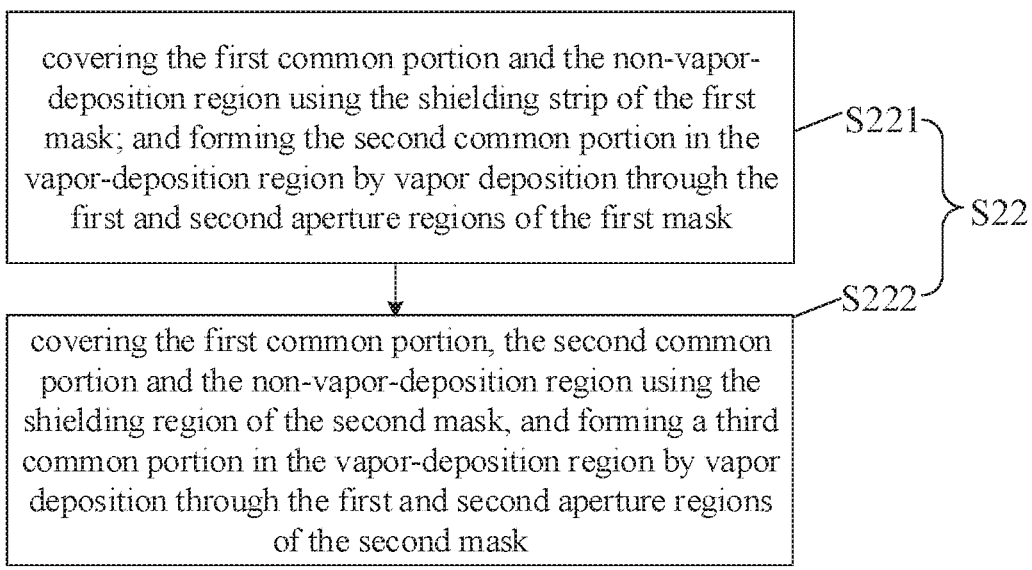
FIG. 21 is a schematic flow chart of a method for manufacturing yet still another display panel according to an embodiment of the present disclosure.

FIG. 21 is a schematic flow chart of a method for manufacturing yet still another display panel according to an embodiment of the present disclosure. In another embodiment, as shown in FIG. 5, FIG. 6, FIG. 7 and FIG. 21, when a width of the non-vapor-deposition region 52 in the first direction is equal to a width of the shielding block 40, vapor deposition can be performed using masks as shown in FIG. 6. As shown in FIG. 7 and FIG. 21, the abovementioned step S22 of covering the first common portion 31 using the shielding strip 4220 of the auxiliary mask 42 and forming the second common portion 32 in the vapor-deposition region 52 by vapor deposition through the aperture region 421 of the auxiliary mask 42 includes following steps.

At step S221, the first common portion 31 and the non-vapor-deposition region 51 are covered using a shielding strip 6120 of a first mask 61, and a second common portion 32 is formed in the vapor-deposition region 52 by vapor deposition through a first aperture region 6111 and a second aperture region 6112 of the first mask 61.

At step S222, the first common portion 31, the second common portion 32 and the non-vapor-deposition region 51 are covered using a shielding region 622 of a second mask 62, a third common portion 33 is formed in the vapor-deposition region 52 by vapor deposition through an aperture region 621 of the second mask 62, and an uneven portion 30 is formed between the common layer 32 and the first common portion 31, and between the third common portion 33 and the second common portion 32.

As shown in FIG. 6, when the first mask 61 has a same shape and a same area as the main mask 41, the abovementioned step S221 of covering the first common portion 31 and the non-vapor-deposition region 51 using the shielding strip 6120 of the first mask 61 and forming the second common portion 32 in the vapor-deposition region 52 by vapor deposition through the first aperture region 6111 and the second aperture region 6112 of the first mask 61 includes following steps.

The main mask 41 as shown in FIG. 6 is translated by a first distance in the first direction x. The first distance is equal to a width of a shielding block 40. The translated main mask 41 is used as a first mask 61.

A second common portion 32 is formed in the vapor-deposition region 52 by vapor deposition through the aperture region 411 of the translated main mask 41.

Figure 22:
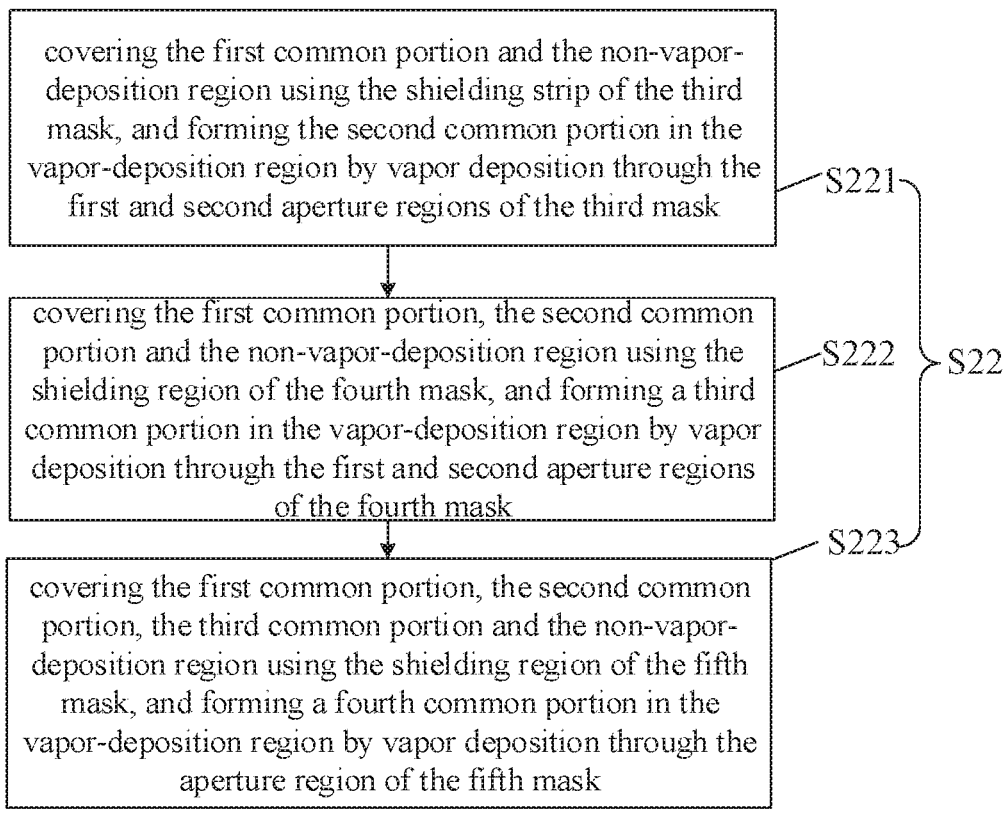
FIG. 22 is a schematic flow chart of a method for manufacturing yet still another display panel according to an embodiment of the present disclosure.

In an example, a width of the aperture region 411 of the first mask 41 in the first direction x is equal to a width of the shielding region 412 of the main mask 41 in the first direction x, the main mask 41 is provided with a supporting strip 413 extending along the first direction x, and the auxiliary masks include a third mask 63, a fourth mask 64 and a fifth mask 65. The shape of each mask is as shown in FIG. 12, and details thereof will not be described herein. FIG. 22 is a schematic flow chart of a method for manufacturing yet still another display panel according to an embodiment of the present disclosure. As shown in FIG. 13 and FIG. 22, the abovementioned step S22 of covering the first common portion and the non-vapor-deposition region 51 using the shielding strip 4220 of an auxiliary mask 42 and forming the second common portion 32 in the vapor-deposition region 52 by vapor deposition through the aperture region 421 of the auxiliary mask 42 includes following steps.

At step S221, the first common portion 31 and the non-vapor-deposition region 51 are covered using the shielding strip 6320 of the third mask 63, and the second common portion 32 is formed in the vapor-deposition region 52 by vapor deposition through the first aperture region 6311 and the second aperture region 6312 of the third mask 63.

At step S222, the first common portion 31, the second common portion 32, and the non-vapor-deposition region 51 are covered using the shielding region 642 of the fourth mask 64, and the third common portion 33 is formed in the vapor-deposition region 52 by vapor deposition through the first aperture region 6411 and the second aperture region 6412 of the fourth mask 64.

At step S223, the first common portion 31, the second common portion 32, the third common portion 33 and the non-vapor-deposition region 51 are covered using the shielding region 652 of the fifth mask 65, and a fourth common portion 34 is formed in the vapor-deposition region 52 by vapor deposition through the aperture region 651 of the fifth mask 65.

An uneven portion 30 is formed between the second common portion 32 and the first common portion 31, between the third common portion 33 and the second common portion 32, between the fourth common portion 34 and the third common portion 33, and between the fourth common portion 34 and the second common portion 32.

In an example, as shown in FIG. 12, when the third mask 63 has a same shape and a same area as the main mask 41, the abovementioned step S221 of covering the first common portion 31 and the non-vapor-deposition region 51 using the shielding strip 6320 of the third mask 63 and forming the second common portion 32 in the vapor-deposition region 52 by vapor deposition through the first aperture region 6311 and the second aperture region 6312 of the third mask 63 includes following steps.

The main mask 41 is translated by a first distance in the first direction x, and the first distance is equal to a width of the shielding block 40 in the first direction x.

The translated main mask 41 is used as the third mask 63.

The second common portion 32 is formed in the vapor-deposition region 52 by vapor deposition through the first aperture region 4111 and the second aperture region 4112 of the translated main mask 41.

Figure 23:
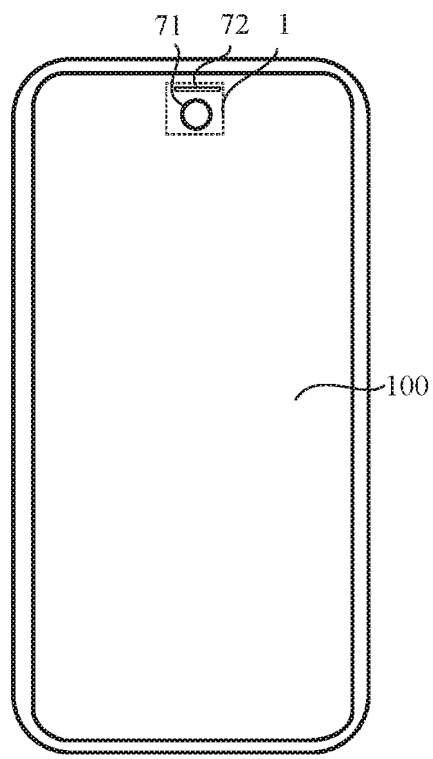
FIG. 23 is a schematic diagram of a display device according to an embodiment of the present disclosure.

An embodiment of the present disclosure further provides a display device. As shown in FIG. 23, which is a schematic diagram of a display device according to an embodiment of the present disclosure, the display device includes the display panel 100 described above. The structure of the display panel 100 has been described in details in the above embodiments, and will not be further described herein. It should be noted that the display device shown in FIG. 23 is merely illustrative, and the display device can be any electronic device having a display function, such as a cellphone, a tablet computer, a notebook computer, an electronic paper book, or a television.

For the display device provided by this embodiment of the present disclosure, a hollow region and a display region surrounding the hollow region are provided in the display panel of the display device, and a common layer is formed in the display region while no common layer is formed in the hollow region, which can prevent the common layer from affecting light transmittance of the hollow region. In this way, a light-sensing device such as a camera, a light sensor, a depth sensor, and an iris identification sensor can be disposed in the hollow region to enrich functions of use of the display panel.

Moreover, in this embodiment of the present disclosure, an uneven portion is disposed in the common layer of the display panel, so that when manufacturing the display panel, the display region of the display panel can be divided into at least two parts. Then, a first common portion and a second common portion can be sequentially deposited at the plurality of parts by at least two vapor deposition processes through the mask as shown in FIG. 3, such that the common layer including the first common portion, the second common portion, and the uneven portion can cover the entire display region. In this way, when manufacturing the display panel including the hollow region, cutting operation with respect to the display panel is not necessary, thereby avoiding cutting residues and thus achieving reliable packaging of the display panel. Moreover, by corresponding design of the shape of the mask, it is possible to manufacture a display panel including a hollow region having various shapes, which greatly reduces the process difficulty of manufacturing the display panel including the hollow region.

In addition, when the display panel performs displaying, carriers generated in the light-emitting device move toward the light-emitting layer through the transfer of the common layer, so that the light-emitting layer emits light, and the display panel performs displaying. In this embodiment of the present disclosure, an uneven portion is provided between the first common portion and the second common portion, so that mutual crosstalk of carriers in different display regions can be avoided. That is, with the uneven portion, carriers can be confined inside the corresponding light-emitting device, thereby avoiding crosstalk of display images at different positions in the display region.

In an example, as shown in FIG. 23, the display device further includes a light-sensing device 71 and/or a sounding device 72. The light-sensing device 71 and the sounding device 72 are disposed in the hollow region 1 of the display panel. The light-sensing device 71 can be used for photographing. The light-sensing device 71 may include one or more of a camera, a light sensor, and an iris recognition sensor. The sounding device 72 can be used for playing sounds, so as to enrich the user's diverse use needs.

What is claimed is:

1. A display panel, wherein the display panel has a hollow region and a display region surrounding the hollow region, the display panel comprises:
    a plurality of light-emitting devices arranged in the display region, the plurality of light-emitting devices comprising a common layer, and no common layer is arranged in the hollow region,
    wherein the common layer comprises at least one first common portion and at least one second common portion that are disposed in a same layer, and the common layer further comprises at least one uneven portion disposed between the at least one first common portion and the at least one second common portion,
    wherein the at least one uneven portion comprises at least one protrusion, and an end of the at least one first common portion directly contacts and is covered by a respective second common portion of the at least one second common portion at a respective protrusion of the at least one protrusion, and
    wherein a width of the hollow region along a first direction is equal to a total sum of the width of one of the at least one first common portion along the first direction and the width of each of the at least one second common portion along the first direction.

2. The display panel according to claim 1, wherein the at least one first common portion and the at least one second common portion both extend along a second direction and are alternately arranged along a first direction.

3. The display panel according to claim 2, wherein the at least one first common portion comprises a plurality of first common sub-portions and at least one second common sub-portion, and the at least one uneven portion comprises a plurality of first uneven portions and at least one second uneven portion;
- each of the at least one second common sub-portion and the at least one second uneven portion is divided into at least two parts by the hollow region; and
- each of the plurality of first uneven portions is disposed between a respective second common portion of the at least one second common portion and a respective first common sub-portion of the plurality of first common sub-portion that are adjacent, and each of the at least one second uneven portions is disposed between a respective second common portion of the at least one second common portion and a respective second common sub-portion of the at least one second common sub-portion that are adjacent.

4. The display panel according to claim 3, wherein
in the first direction, a width of each of the at least one first common portion is equal to a width of each of the at least one second common portion;
the at least one second common portion comprises at least one third common sub-portion and at least one fourth common sub-portion;
in the second direction, each of the at least one third common sub-portion, each of the plurality of first common sub-portions, and each of the plurality of first uneven portions have a same length; a sum of a length of one of the at least one fourth common sub-portion and a length of the hollow region is equal to a length of each of the at least one third common sub-portion; a sum of a length of one of the at least one second common sub-portion and the length of the hollow region is equal to a length of each of the at least one third common sub-portion;
the at least one uneven portion further comprises at least one third uneven portion;
each of the plurality of first uneven portions is disposed between a respective first common sub-portion of the plurality of first common sub-portions and a respective third common sub-portion of the at least one third common sub-portion that are adjacent;
each of the at least one second uneven portion is disposed between a respective second common sub-portion of the at least one second common sub-portion and a respective fourth common sub-portion of the at least one fourth common sub-portion; and
each of the at least one third uneven portion is disposed between a respective first common sub-portion of the plurality of first common sub-portions and a respective fourth common sub-portion of the at least one fourth common sub-portion, or between a respective second common sub-portion of the at least one second common sub-portion and a respective third common sub-portion of the at least one third common sub-portion.

5. The display panel according to claim 1, wherein each of the plurality of light-emitting devices further comprises an anode, a light-emitting layer, and a cathode, and the at least one uneven portion does not overlap with the light-emitting layer of any of the plurality of light-emitting devices.

6. The display panel according to claim 5, wherein a pixel definition layer is provided in the display region, the pixel definition layer includes a plurality of aperture regions, the light-emitting layer of each of the plurality of light-emitting devices is disposed in a respective aperture region of the plurality of aperture regions, and each of the at least one uneven portion is disposed between two adjacent aperture regions of the plurality of aperture regions.

7. The display panel according to claim 6, wherein a distance d1 between two adjacent aperture regions of the plurality of aperture regions satisfies 15 µm≤d1≤25 µm, and in a direction along a line connecting two adjacent aperture regions of the plurality of aperture regions, a length d2 of the uneven portion between the two adjacent aperture regions of the plurality of aperture regions satisfies 5 µm≤d2≤15 µm.

8. The display panel according to claim 5, wherein the common layer is reused as the cathode;
- the display panel further comprises a power trace layer and a connection trace layer, the power trace layer is disposed at a side of the anode facing away from the light-emitting layer, the connection trace layer and the anode are disposed in a same layer, and the cathode is connected to the power trace layer through the connection trace layer.

9. The display panel according to claim 5, wherein the common layer comprises one or more of an electron transport layer, an electron injection layer, a hole transport layer, and a hole injection layer; and
- the at least one uneven portion further comprises at least one recess, and each of the at least one first common portion is separated from a respective second common portion of the at least one second common portion by a respective recess of the at least one recess.

10. The display panel according to claim 6, wherein each of the at least one uneven portion is disposed on and contacts a surface of the pixel definition layer.

11. The display panel according to claim 1, further comprising:
- at least one thin film transistor disposed below the plurality of light-emitting devices,
- wherein an orthographic projection of the at least one uneven portion on the display panel overlaps an orthographic projection of a respective one of the at least one thin film transistor on the display panel.

* * * * *